United States Patent [19]

Ballato

[11] Patent Number: 4,634,914
[45] Date of Patent: Jan. 6, 1987

[54] PIEZOELECTRIC SAW DEVICE WITH A CORRUGATED SURFACE

[75] Inventor: Arthur Ballato, Long Branch, N.J.

[73] Assignee: The United States of America as represented by the Secretary of the Army, Washington, D.C.

[21] Appl. No.: 732,120

[22] Filed: May 9, 1985

[51] Int. Cl.[4] .............................................. H01L 41/08
[52] U.S. Cl. .............................. 310/313 D; 310/313 B; 333/195; 333/153
[58] Field of Search ............ 310/313 R, 313 A, 313 B, 310/313 C, 313 D, 326, 327; 333/150–155, 193–196

[56] References Cited

U.S. PATENT DOCUMENTS

| | | | |
|---|---|---|---|
| 4,290,033 | 9/1981 | Kagiwada et al. | 333/153 X |
| 4,388,146 | 1/1983 | Ballato | 156/626 |
| 4,389,275 | 6/1983 | Ballato | 156/626 |

OTHER PUBLICATIONS

P. V. H. Sabine, "Rayleigh–Wave Propagation on a Periodically Roughened Surface," Electronics Letters, vol. 6, No. 6, 19 Mar. 1970, p. 1491.
Lukaszek and Ballato, "What SAW Can Learn from BAW: Implications for Future Frequency Control . . . ", Proc. 1980 IEEE Ultrasonics Symposium, pp. 173–183, Nov. 1980.
Ballato, "Transduction of Surface Acoustic Waves by Interdigital Arrays . . . ", Tech. Report, ECOM-4359, U.S. Army Electronics Comm., Oct. '75.
Rischbeiter, F., "Measurements of Surface Waves in Solids," Acustica, 1965, 16, pp. 75–83.
Vig et al., "Etching Studies on Singly and Doubly Rotated Quartz Plates," Proc. 33rd An. Freq. Control Symp., pp. 351–358, 1979.

Primary Examiner—Mark O. Budd
Attorney, Agent, or Firm—Sheldon Kanars; Jeremiah G. Murray; John T. Rehberg

[57] ABSTRACT

An acoustic surface wave device is configured as a bandstop filter. The device has groups of sinusoidal corrugations cut into the top surface of a piezoelectric substrate between the input and output sets of interdigital transducers. The groups of corrugations selectively scatter certain surface acoustic wave spectral components traveling between the input and output transducers. The scattered components are converted to bulk vibration and do not impinge upon the output transducer; other components travel from input to output transducer relatively undiminished. Thus, a band of scattered surface acoustic spectral components is filtered from the input spectrum.

8 Claims, 8 Drawing Figures

PIEZOELECTRIC SAW DEVICE WITH A CORRUGATED SURFACE

The invention described herein may be manufactured, used and licensed by or for the Government without payment to me of any royalty thereon.

BACKGROUND OF THE INVENTION

1. Field of the Invention

This invention relates generally to bandstop filters and more particularly to solid state microwave bandstop filters which utilize both surface and bulk acoustic waves in a piezoelectric medium.

2. Description of the Prior Art

Surface acoustic wave (SAW) devices are often employed as filters or resonators in high frequency applications.

The advantages of using SAW devices over other frequency control methods such as LC circuits, coaxial delay lines, or metal cavity resonators are high Q, low series resistance, small size and good frequency-temperature stability. SAW resonators also possess advantages over bulk acoustic wave (BAW) resonators because the latter must be cut very thin to achieve high frequencies and are consequently quite fragile.

Typically, a SAW device contains a substrate of piezoelectric material such as quartz, lithium niobate, zinc oxide, or cadmium sulfide. Input and output transducers are formed upon the substrate. The transducers convert input electrical signals to surface acoustic waves (SAWs) propagating upon the surface of the substrate and then reconvert the acoustic energy to an electric output signal. The input and output transducers are frequently configured as interdigital electrode fingers which extend from pairs of transducer pads. Interdigital transducers may be formed by depositing a thin film of electrically conductive material upon a piezoelectric substrate.

Alternating electrical potential coupled to the input interdigital transducers induces mechanical stresses in the piezoelectric substrate. The resulting strains propagate away from the input transducer along the surface of the substrate in the form of surface acoustic waves. These propagating surface waves arrive at the output interdigital transducer where they are reconverted to electrical signals.

SAW devices are often used as filters in a variety of applications. Compared to LC filters, for example, SAW devices can provide a narrower passband and the SAW package occupies much less physical space than an LC filter, along with a superior frequency-temperature behavior. Nevertheless, there are applications for which a typical SAW device passband is too broad or the SAW passband includes certain undesirable frequencies. The present invention meets the need for SAW devices with precisely tailored bandstop or band-notch characteristics.

An article pertinent to the understanding of the present invention which discusses the propagation of both surface acoustic waves (also referred to as Rayleigh waves), and bulk acoustic waves is: P. V. H. Sabine, "Rayleigh-wave propagation on a periodically roughened surface," Electronics Letters, Vol. 6, No. 6, Mar. 19, 1970, pp. 149-151. The Sabine article discusses a phenomenon peculiar to surface wave propagation upon a medium with a non-flat surface. The article presents results which show that surface acoustic waves suffer sharp attenuation when travelling over a medium surface which is corrugated in a sinusoidal shape. The attenuation is caused by the sinusoidal corrugations. The corrugations cause a scattering of some of the surface acoustic wave energy into bulk vibration in longitudinal and shear modes. The bulk vibratory modes withdraw energy from the surface, resulting in attenuation of the surface wave.

Sinusoidal corrugations with a fixed periodicity selectively scatter only certain wavelength components of an incident surface acoustic wave spectrum. Other wavelength components of the incident spectrum are not effectively scattered and they traverse the corrugated surface with minimal attenuation. Thus, a series of sinusoidal corrugations cut into the surface of a medium may be used to filter selected surface wave spectral components from an incident SAW spectrum. Undesired spectral components (wavelengths) will be scattered into bulk vibration and will effectively disappear from the surface wave spectrum. The balance of the surface wave spectrum will traverse the corrugations relatively undiminished.

The relationship between SAW attenuation and sinusoidal corrugation wavelength depends upon the Poisson's ratio(s) of the medium. Poisson's ratio is a physical constant which characterizes the behavior of a solid under stress. When a typical isotropic body is stretched in one direction, the body contracts at right angles (i.e. laterally) to the stretch. Poisson's ratio, $\sigma$, is the ratio of lateral percentage contraction to longitudinal percentage extension. Poisson's ratio can also be expressed as a ratio of material elastic constants or compliances. Values of Poisson's ratio may range from 0 to 0.50. An isotropic body has a single value for Poisson's ratio. However, an anisotropic body, such as quartz or other piezoelectrics commonly employed as substrates for SAW devices, may be characterized by several Poisson's ratios. The Sabine reference presents data appropriate to isotropic media, but the applicability of the results to anisotropic media is apparent to those skilled in the art, and will be illustrated later. For simplicity, the scattering phenomenon will be discussed first in terms of an isotropic medium.

In an isotropic body with Poisson's ratio, $\sigma=0.1$, if a surface acoustic wave of wavelength $\lambda_R$ (Rayleigh wavelength) is incident upon sinusoidal corrugations of wavelength $\lambda$, strong scattering of the incident surface acoustic wave into bulk vibration will occur when $0.5=\lambda_R/\lambda$ or when $1.7=\lambda_R/\lambda$. (Actually, Sabine presents scattering data in terms of the parameter $\lambda_s/\lambda$ where $\lambda_s$ is the medium shear wavelength and $\lambda$ is the surface corrugation wavelength. However, it is well known to those skilled in the art that the Rayleigh velocity is constrained to be only slightly less than the bulk shear velocity for isotropic media and the Rayleigh velocity is only 2% or 3% less than the slower bulk shear velocity for anisotropic media. Consequently $\lambda_R \approx \lambda_s$. For convenience, the invention will be discussed in terms of Rayleigh wavelengths, $\lambda_R$. Sabine's results are merely normalized in terms of $\lambda_s$ for mathematical convenience.) The amplitude of the surface acoustic wave spectral component of the wavelength $\lambda_R$ after scattering is substantially diminished. The precise amount of attenuation depends upon the number of sinusoidal corrugations encountered by the incident surface acoustic wave. Greater attenuation is produced by a large number of corrugations than by a small number. For Poisson's ratio, $\sigma=0.1$, in an isotropic medium, for example, the condition $0.5 = \lambda_R/\lambda$ yields an attenuation as great as 10 dB per corrugation wavelength. Thus, surface waves of wavelength $\lambda_R = 0.5\lambda$, propagating in such a medium would be attenuated by approximately 100 dB after traversing 10 corrugations.

The aforementioned attenuation data are somewhat dependent upon the Poisson's ratio for the medium, as already mentioned. The Sabine reference illustrates how the SAW attenuation peaks become lower and broader as Poisson's ratio increases from $\sigma = 0.1$ to $\sigma = 0.4$. For values of Poisson's ratio $\sigma = 0.4$, for example, the attenutation per corrugation is between 0.1 dB and 1.0 dB, but the strong-scattering ranges for the ratios $\lambda_R/\lambda$ are much greater.

BRIEF SUMMARY OF THE INVENTION

It is an object of the present invention to provide a simple, relatively inexpensive, compact microwave bandstop filter.

It is another object of the present invention to provide an effective SAW device which is amenable to mass-production techniques.

A further object of the present invention is to provide a SAW filter with hitherto unachievably narrow bandstop characteristics.

Still another object of the present invention is to provide a device capable of filtering selected surface acoustic wavelengths by utilizing a group of sinusoidal corrugations to scatter unwanted surface acoustic wavelengths into bulk vibration.

A still further object of the present invention is to provide a SAW device on a piezoelectric substrate capable of filtering a precisely tailored band of RF frequencies by utilizing several groups of sinusoidal corrugations to scatter a band of corresponding surface acoustic waves into bulk vibration.

The present invention utilizes the aforementioned principle of SAW scattering by surface sinusoidal corrugations to produce an electronic bandstop filter with a precisely tailored stop band.

The inventive device is a surface acoustic wave (SAW) device having two sets (input and output) of interdigital transducers (IDT's) deposited upon a piezoelectric substrate. A group of sinusoidal corrugations is located upon the substrate in the path of the surface acoustic waves emanating from the input IDTs. The corrugations selectively scatter certain wavelengths from the input SAW spectrum and convert them to bulk acoustic waves (BAWs). The resulting BAWs do not affect the output IDT. The output IDT sees the spectrum generated by the input IDT with the wavelength scattered by the sinusoidal corrugations notched out of the input spectrum. Thus, the corrugations serve as a very narrow bandstop filter by preventing certain wavelengths from reaching the output IDT and any circuitry enhanced to it.

The bandstopping characteristics of the device may be broadened by placing several groups of sinusoidal corrugations between the input and output IDTs. Each group of corrugations consists of 10–1000 sinusoidal corrugations of the same wavelength, $\lambda$, chosen according to the SAW attenuation curve for the piezoelectric substrate, discussed previously, to scatter an unwanted surface acoustic wavelength. The wavelengths of the groups, that is, the individual values of $\lambda$, may be chosen close together so that a broad band of surface acoustic wavelengths emanating from the input IDT is driven into bulk acoustic waves and never reaches the output IDT.

Other embodiments of the device feature sawtooth corrugations which behave in a manner similar to sinusoidal corrugations and which may also be grouped to provide broader-band filtering. Sawtooth corrugations are somewhat less expensive to fabricate than sinusoidal corrugations, but sawtooth corrugations provide slightly less effective scattering than sinusoidal corrugations. Hence a greater number of sawtooth corrugations is required to achieve a desired SAW attenuation level.

The bottom side of the piezoelectric substrate is covered with sound absorbent material such as tape, or a viscous polymer such as polymide. The sound absorber prevents reflection of any bulk acoustic vibrations which might disturb the bandstopping process.

Further objects and advantages of the present invention will become apparent to those familiar with the art upon examination of the following detailed description and accompanying drawings.

DETAILED DESCRIPTION OF THE PREFERRED EMBODIMENTS

Figure 1:
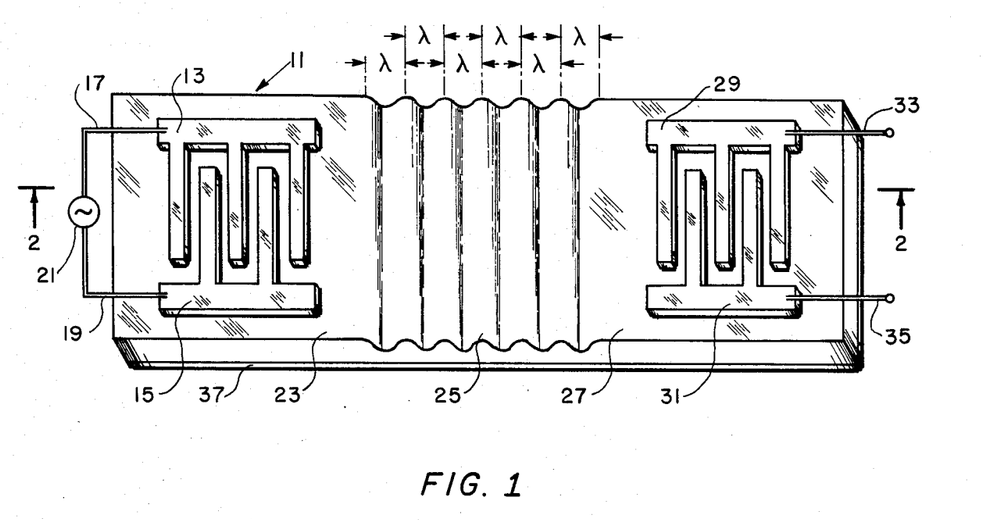
FIG. 1 is a perspective view of one preferred embodiment of the present invention.

Referring to the drawings, and more particularly to FIG. 1, wherein like numerals refer to like components throughout, reference numeral 11 designates generally a piezoelectric substrate. In the preferred embodiment, the piezoelectric substrate is ST-cut quartz, although other quartz cuts such as SST-cut quartz and other piezoelectric materials such as lithium niobate are acceptable. The SST-cut is described in Lukaszek and Ballato, "What SAW Can Learn from BAW: Implications for Future Frequency Control, Selection & Signal Processing," Proc. 1980 IEEE Ultrasonics, Symposium, Nov. 1980 pp. 173–183. A pair of input interdigital transducers 13 and 15 are deposited upon the piezoelectric substrate. The input transducers are connected by connectors 17 and 19 to an input RF signal 21.

When the input signal 21 is applied to the transducers 13 and 15, the transducers stimulate the piezoelectric substrate 11 and surface acoustic waves propagate along the flat substrate surface 23.

Reference numeral 25 designates a group of sinusoidal corrugations cut into the top of the otherwise flat piezoelectric surface of substrate 11. The corrugations may be easily cut by utilizing the ion milling or photolytic etching techniques taught in U.S. Pat. Nos.

4,388,146 and 4,389,275, both issued to the present inventor. In the embodiment illustrated in FIG. 1, all of the corrugations in the group 25 have the same wavelength, λ. When the surface acoustic waves emanating from the interdigital transducers 13 and 15 encounter the corrugations 25, the surface waves with wavelength(s), $\lambda_R$, satisfying the scattering criteria for the substrate are scattered into bulk acoustic vibration. Only those component wavelengths, $\lambda_R$, which satisfy the scattering criteria for the substrate are scattered into bulk vibration. The resulting bulk vibration, in both shear and longitudinal modes, is eventually absorbed by the sound absorbing material 37 attached to the bottom of the substrate 11. Other wavelength components emanating from the interdigital transducers 13 are able to traverse the corrugations 25 relatively undiminished. Thus, the scattered components are effectively eliminated from the surface acoustic spectrum. After the unscattered surface acoustic waves traverse the group of corrugations 25, they encounter a flat piezoelectric surface 27. The flat piezoelectric surface 27 on the output side of the corrugations 25 is similar to the flat piezoelectric surface 23 on the input side of the corrugations. However, the vibrational spectrum of the waves on the surface 27 lacks the aforementioned wavelength components which have been scattered into bulk vibration.

The surface acoustic vibrations traveling along the surface 27 encounter a second pair of interdigital transducers 29 and 31. The transducers 29 and 31 reconvert acoustic vibrations to an alternating electric potential which is connected to external circuitry via connectors 33 and 35.

The foregoing has illustrated how the presence of a group of sinusoidal corrugations 25 positioned on a SAW piezoelectric substrate between two uniformly flat surfaces 23 and 27 serves to prevent the transmission of specific surface acoustic wavelength components from one surface 23 to the other surface 27. Thus, the corrugations serve as a bandstopping filter.

The amplitude of the individual corrugations must be small compared to a Rayleigh wavelength. The aforementioned article by Sabine presents results based on the formula:

$$\xi_o/\lambda = 0.01$$

where $2\xi_o$ is the peak-to-valley amplitude of the sinusoidal corrugations, and λ is the corrugation wavelength.

The amount of attenuation achieved depends upon the number of individual sinusoidal corrugations in the group. Greater attenuation is achieved by a larger number of corrugations. Typically, between 10 and 1000 corrugations are satisfactory.

The amount of attenuation achieved per individual sinusoidal corrugation depends, as shown by the Sabine reference, upon the Poisson's ratio, σ, of the substrate. Piezoelectric materials are anisotropic, and as mentioned before, may be characterized by several Poisson's ratios. Consequently, the precise shape of the SAW attenuation curve for piezoelectric depends upon a mathematical combination of the several values of the Poisson's ratios. For a given crystal material and crystal cut the saw attenuation curve will vary slightly from the shapes shown by Sabine because of its dependence upon several Poisson's ratios. However, the two-peaked shape of the curve persists, although the width of each peak and the precise location of the peaks as a function of $\lambda_R/\lambda$ depends upon the mix of Poisson's ratios for the appropriate crystalline material and cut.

Figure 5:
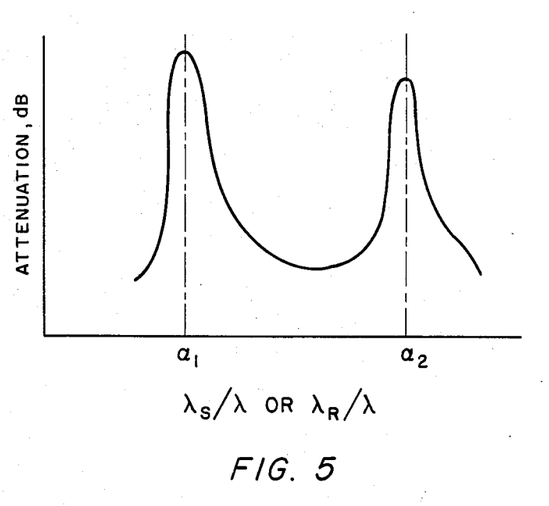
FIG. 5 is a graph illustrative of the surface wave attenuation curve for a piezoelectric substrate.

FIG. 5 is illustrative of the general shape of the surface wave attenuation curve for a piezoelectric substrate. The attenuation curve exhibits two maxima designated as $\alpha_1$ and $\alpha_2$. The precise values of $\alpha_1$ and $\alpha_2$ as well as the widths of the peaks at $\alpha_1$ and $\alpha_2$ depend upon a mathematical mix of the Poisson's ratios for the particular piezoelectric substrate employed.

For an anisotropic medium such as ST-cut quartz, Table 1 below lists the determinative absolute values of Poisson's ratios, calculated as ratios of the cyrstal elastic constants, $C_{ij}$ where i is from 1 to 3 and j is from 1 to 3.

TABLE 1

$$\left|\frac{C_{12}}{C_{11}}\right| = \frac{8.612}{86.740} = 0.0993$$

$$\left|\frac{C_{12}}{C_{22}}\right| = \frac{8.612}{130.768} = 0.0659$$

$$\left|\frac{C_{13}}{C_{11}}\right| = \frac{27.502}{86.740} = 0.317$$

$$\left|\frac{C_{13}}{C_{33}}\right| = \frac{27.502}{96.868} = 0.284$$

$$\left|\frac{C_{23}}{C_{22}}\right| = \frac{4.938}{130.768} = 0.0378$$

$$\left|\frac{C_{23}}{C_{33}}\right| = \frac{4.938}{96.868} = 0.0510$$

The elastic constant values, $C_{ij}$, shown in Table 1 above, are provided in "Transduction of Acoustic Surface Waves by Interdigital Arrays, and Equivalent Circuit Representations," Technical Report ECOM-4359, U.S. Army Electronics Command, Fort Monmouth, N.J. October 1975, authored by the present inventor.

Examination of Table 1 shows that the appropriate values for Poisson's ratios range between 0.0378 and 0.317. The precise shape of the SAW attenuation curve for ST-cut quartz depends upon a mathematically weighted combination of all of the above Poisson's ratios.

Because the location of the attenuation peaks depends solely upon Poisson's ratio(s), it is apparent to those skilled in the art who examine the Sabine attenuation graphs that the attenuation peaks for ST-cut quartz occur within the ranges specified below:

$0.3 \leq \lambda_s/\lambda \leq 0.6$ and
$1.4 \leq \lambda_s/\lambda \leq 2.05$ and because $\lambda_S \approx \lambda_R$
$0.3 \leq \lambda_R \lambda \leq 0.6$ and
$1.4 \leq \lambda_R \leq 2.05$ or, in terms of FIG. 5,
$0.3 \leq \alpha 1 \leq 0.6$
$1.4 \leq \alpha 2 \leq 2.05$ Thus, the inventive device, when fabricated upon an ST-cut quartz substrate with a series of sinusoidal corrugations of wavelength λ will strongly attenuate certain SAW wavelengths which fall within the ranges specified below:

$0.3\lambda \leq \lambda_R \leq 0.6\lambda$ and $1.4\lambda \leq \lambda_R \leq 2.05$ The precise SAW wavelength(s), $\lambda_R$, which are excised by a device with sinusoidal corrugations with wavelength $\lambda$, depend upon the precise shape of the SAW attenuation curve for the piezoelectric substrate. The SAW attenuation curve for ST-cut quartz, for example, has not been published to the best of this inventor's knowledge.

However, the following one-time procedure will reveal the shape of the SAW attenuation curve for ST quartz, while simultaneously yielding a series of devices taught by the above-described inventive procedure. It is necessary to fabricate a limited number of devices, all devices with identical IDT configurations, and each device with a group of sinusoidal corrugations of slightly different wavelength. One device should be fabricated with the same IDT configuration as the others but with no corrugations to serve as a reference for comparison. The output spectra of each of the corrugated devices may then be compared with the output of the uncorrugated reference device. Comparison of the output of each corrugated device with the uncorrugated device will reveal the frequencies which are most strongly attenuated by the sinusoidal corrugations on each device. The procedure is outlined in more detail below.

It is well known to those skilled in the art that the general shape of the SAW spectrum emanating from the input IDTs 13 and 15, and propagating on the surface 23, is determined by the spacing between the individual fingers. Roughly speaking, the central spectral wavelength, $\lambda_{RC}$ is given by:

$S = \lambda_{RC}/2$ where S=center-to-center spacing between adjacent fingers. Thus, the center-to-center spacing between adjacent fingers is approximately one-half of the spectral central wavelength. The width of the spectrum is also roughly predictable by those skilled in the art. A large number of IDTs yield a narrow spectrum, and conversely a small number of IDTs yields a broader spectrum. Consequently, the spectral shape emanating from a given IDT configuration is generally predictable by those skilled in the art.

Figure 6:
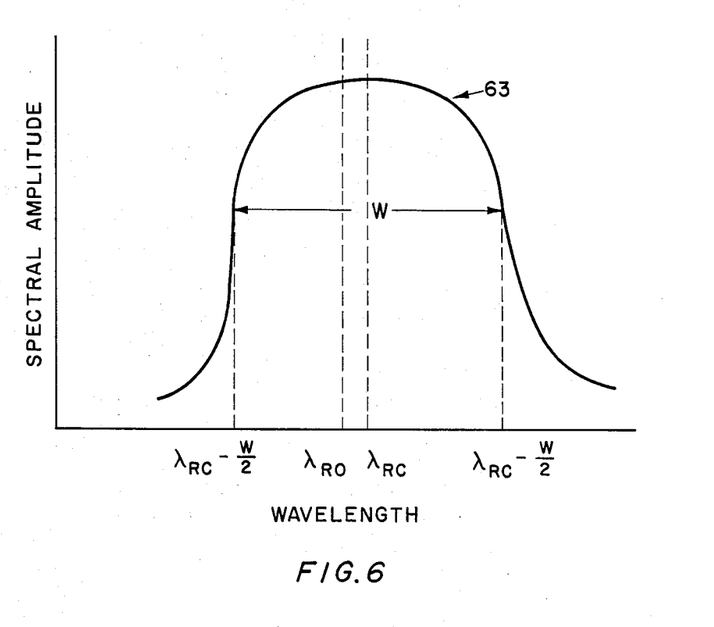
FIG. 6 is a graph of spectral amplitude as a function of wavelength for a prior art device.

FIG. 6 is generally illustrative of a surface acoustic wave spectrum emanating, for example, from input transducers 13, 15 in FIG. 1. The approximate central wavelength is designated by $\lambda_{RC}$, and approximate width of the spectrum is designated by w. The device may be considered capable of transducing wavelengths between $\lambda_{RC} - w/2$ and $\lambda_{RC} + w/2$. (FIG. 6 may also be considered representative of the performance of a typical prior art device).

To determine the SAW attenuation characteristics and thus the values of $\alpha_1$ and $\alpha_2$ of FIG. 5, for a given piezoelectric substrate, one may simply fabricate several devices with identical input and output IDT's on substrates of the same material and crystal-cut and orientation. One device should have no sinusoidal corrugations between the input and output IDTs. Each of the other devices has one group of sinusoidal corrugations with wavelengths given for example, by:

$\lambda_1 = \lambda_{Ro}/0.30$
$\lambda_2 = \lambda_{Ro}/0.35$
$\lambda_3 = \lambda_{Ro}/0.40$
$\lambda_4 = \lambda_{Ro}/0.45$
$\lambda_5 = \lambda_{Ro}/0.50$
$\lambda_6 = \lambda_{Ro}/0.55$
$\lambda_7 = \lambda_{Ro}/0.60$ where $\lambda_{Ro}$ is a strong spectral component observable in the SAW spectrum of the uncorrugated device. For example, $\lambda_{Ro}$ may be selected as the central spectral wavelength, $\lambda_{RC}$, or any other wavelength in the range $\lambda_{RC} - w/2$ to $\lambda_{RC} + w/2$. In the example of FIG. 6, $\lambda_{Ro}$ is chosen to be slightly less than $\lambda_{RC}$. The above equations for $\lambda_1$ to $\lambda_7$ are derived from the aforementioned relationship for the location of the SAW attenuation curve peak, namely $0.3 \leq \lambda_R/\lambda \leq 0.6$, or $0.3 \leq \alpha_1 \leq 0.6$.

Simple spectral analysis of the outputs of each of the aforementioned seven devices and comparison of the output spectra of the seven devices with the uncorrugated device will indicate the corrugation wavelength $\lambda_i$, $i = 1, \ldots 7$ which most strongly attenuates $\lambda_{Ro}$. Further comparison of the output spectra of the corrugated devices with the uncorrugated device will show which spectral wavelengths are strongly attenuated by specific corrugation wavelengths, thus yielding the shape, width, and location of the first peak of the SAW attenuation curve located at $\alpha_1$ in FIG. 5, for the piezoelectric substrate.

Figure 7:
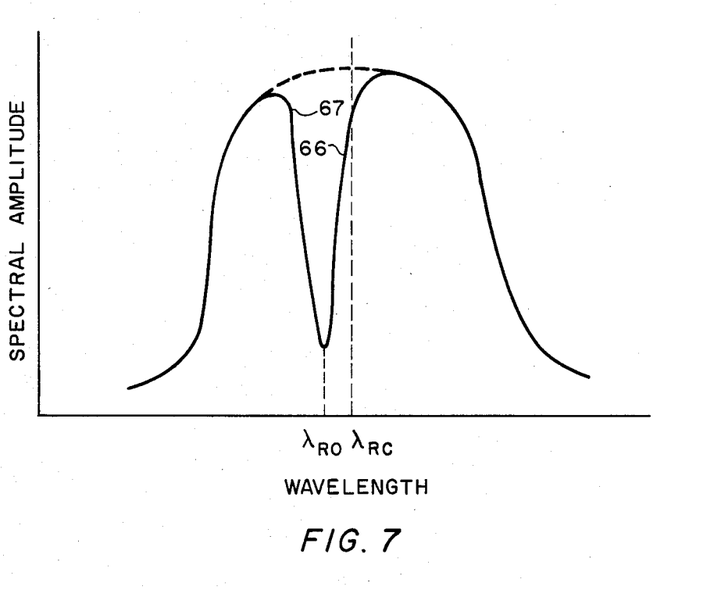
FIG. 7 is a graph of spectral amplitude as a function of wavelength for one of the preferred embodiments of the present invention.

FIG. 7 is illustrative of the spectral amplitude curve which one of the seven devices described above will exhibit. If, for example, the device with corrugations with wavelength $\lambda_5$ were to produce a spectral amplitude with great attenuation at wavelength $\lambda_{Ro}$, as shown in FIG. 7, then the value of $\alpha_1$ in FIG. 5 would be given by: $\alpha_1 = \lambda_{Ro}/\lambda_5$. Further refinement of the attenuation curve shape and the precise value of $\alpha_1$ in FIG. 5, follows simply from experiments at corrugation wavelengths intermediate to those in the example above. Thus, FIG. 7 may also be considered representative of the performance of one of the preferred embodiments of the present invention.

Of course, the same SAW wavelength, $\lambda_{Ro}$ could be excised by one of the devices fabricated according to the second SAW attenuation peak, located at $1.4 = \leq \alpha_2 \leq 2.05$. Experiments to determine the value of $\alpha_2$ would, for example, use devices with corrugations with wavelengths $\lambda_8 - \lambda_{15}$ in accord with the following formulas:

$\lambda_8 = \lambda_{Ro}/1.4$
$\lambda_9 = \lambda_{Ro}/1.5$
$\lambda_{10} = \lambda_{Ro}/1.6$
$\lambda_{11} = \lambda_{Ro}/1.7$
$\lambda_{12} = \lambda_{Ro}/1.8$
$\lambda_{13} = \lambda_{Ro}/1.9$
$\lambda_{14} = \lambda_{Ro}/2.0$
$\lambda_{15} = \lambda_{Ro}/2.05$ The above equations are derived from the aforementioned relationship for the location of the SAW attenuation curve peak, namely $1.4 \leq \alpha_2 \leq 2.05$, and may be augmented by others as described above, for further refinement of the attenuation curve. However, corrugations with wavelengths $\lambda_1 - \lambda_7$ are preferred in practice because they provide greater attenuation per corrugation wavelength, and, being larger than corrugations with wavelengths $\lambda_8 - \lambda_{15}$, they are easier to make and they cause less weakening of the substrate.

An alternative method of determining the shape of the SAW attenuation curve is discussed in Rischbeiter, F., Measurements of surface waves in solids, *Acustica*, 1965, 16, pp. 75–83.

After the SAW attenuation curve is determined, additional devices may be fabricated using the same substrate material without further experimentation because the sinusoidal corrugation wavelength which is most effective in excising a given SAW wavelength can be determined by inspection of the curve.

The foregoing has illustrated how the inventive device excises certain spectral wavelengths $\lambda_{Ro}$ from the SAW spectrum emanating from a pair of input IDTs 13 and 15 and initially propagating on a flat piezoelectric substrate surface 23. Furthermore, it has been shown how the device may be fabricated to excise any preselected SAW wavelength $\lambda_{Ro}$ by choosing and then fabricating the corrugation wavelength, $\lambda$, in accord with the above procedure.

It is necessary to provide a layer of sound absorbing material, 37 to absorb the bulk acoustic waves generated by scattering from the corrugations 25. The absorbing material 37 prevents reflection of the bulk acoustic vibrations which may interfere with the transduction or filtering process. Materials such as tape, polyimide, and various glues, gums or resins will product satisfactory sound absorbtion.

Figure 3:
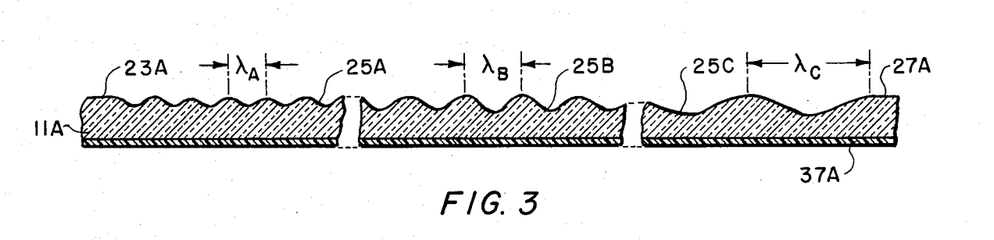
FIG. 3 is a side elevation cross-sectional view of an alternative embodiment of the present invention.

FIG. 3 depicts an alternative preferred embodiment of the present invention. Reference numeral 11A is a piezoelectric substrate. Interdigital transducers (not shown) launch surface acoustic waves which propagate upon the flat upper surface 23A of the substrate 11A. A plurality of groups of sinusoidal corrugations 25A, 25B, and 25C are cut into the upper surface 23A of the piezoelectric. The groups 25A, 25B, and 25C are in the path of the surface acoustic waves. Each group of corrugations has a different wavelength; group 25A has wavelength $\lambda_A$; group 25B has wavelength $\lambda_B$; group 25C has wavelength $\lambda_C$. The number of individual sinusoidal corrugations in each group is chosen in the manner previously described. Each group attenuates a specific wavelength component of the spectrum incident upon it.

For example, suppose the SAW attenuation curve shown in FIG. 6, for the substrate of FIG. 3 has a sharp attenuation peak at $\alpha_i = \lambda_R/\lambda$, i=1, 2 (as mentioned before, for ST-cut quartz, $0.3 \leq \alpha_1 \leq 0.6$ and $1.4 \leq \alpha_2 \leq 2.05$) and it is desired to eliminate the wavelengths $\lambda_{R1}$, $\lambda_{R2}$, and $\lambda_{R3}$ from the incident spectrum. Then the corrugation wavelengths $\lambda_A$, $\lambda_B$ and $\lambda_C$ are chosen in accord with the formulas:

$\lambda_A = \lambda_{R1}/\alpha_i$
$\lambda_B = \lambda_{R2}/\alpha_i$
$\lambda_C = \lambda_{R3}/\alpha_i$
i=1 or 2

The foregoing discussion has illustrated the function of the inventive device in terms of its ability to excise selected Rayleigh wavelengths from the surface wave spectrum emanating from input IDTs 13 and 15. Of course, the performance of the device may be discussed in terms of frequency instead of wavelength. If $V_R$ is the speed of Rayleigh waves in the direction of propagation upon the substrate, then a Rayleigh wave with wavelength $\lambda_R$ is associated with a frequency, $f_R$, given by $f_R = \lambda_R \times V_R$. Consequently, if the device is configured with sinusoidal corrugations 25A, 25B, and 25C which excise wavelengths $\lambda_{R1}$, $\lambda_{R2}$, and $\lambda_{R3}$, respectively, the device functions as a filter capable of eliminating frequencies $f_{R1} = V_R/\lambda_{R1}$, $f_{R2} = V_R/\lambda_{R2}$ and $f_{R3} = V_R/\lambda_{R3}$ from the input frequency spectrum of the input RF signal 21. If $\lambda_{R1}$, $\lambda_{R2}$ and $\lambda_{R3}$ are chosen close together, and $\lambda_{R1} < \lambda_{R2} < \lambda_{R3}$, then the spectral band of width $\lambda_{R3}-\lambda_{R1}$ may be notched from the incident spectrum.

Figure 8:
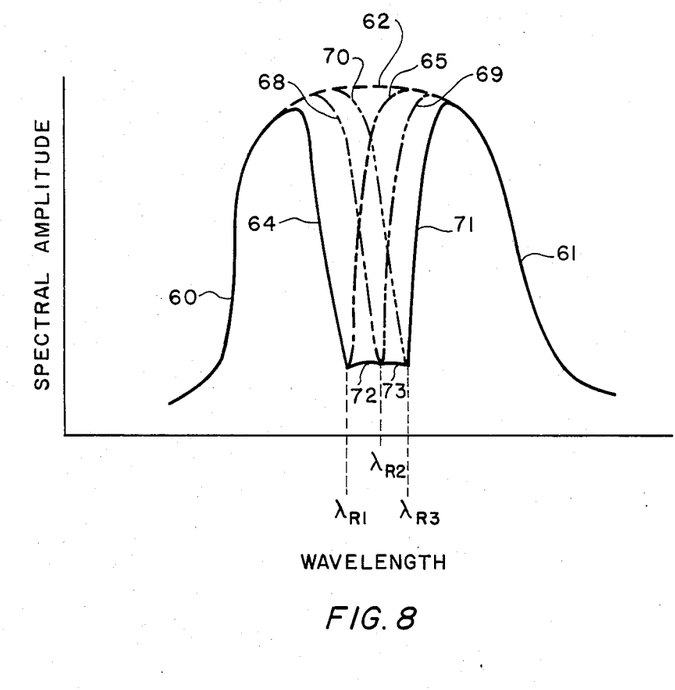
FIG. 8 is a graph of spectral amplitude as a function of wavelength for another of the preferred embodiments of the present invention.

FIG. 8 is illustrative of the performance of the device described by FIG. 3. The graph shows that the spectral amplitudes of wavelength components $\lambda_{R1}$, $\lambda_{R2}$, and $\lambda_{R3}$ are severely attenuated by the three groups of corrugations illustrated in FIG. 3. The net effect of the three groups of corrugations is to notch a relatively broad band of wavelengths from the SAW spectrum which would otherwise propagate between the input and output IDTs, as a comparison of FIGS. 6 and 8 shows. In FIG. 8, the SAW spectral envelope emanating from the input IDTs 13 and 15 is represented by solid lines 60 and 61 and phantom line 62. The spectral envelope defined by lines 60, 61 and 62 is equivalent to the envelope defined by line 63 of FIG. 6. Returning to FIG. 8, lines 64 and 65 indicate the notch cut from the spectral envelope by corrugations which strongly attenuate the wavelength $\lambda_{R1}$. The shape of the notch defined by lines 64 and 65 resembles the notch defined by lines 66 and 67 of FIG. 7. Similarly, in FIG. 8, lines 68 and 69 define a notch cut from the spectral envelope by corrugations which strongly attenuate wavelength $\lambda_{R2}$, and lines 70 and 71 define a notch cut from the spectral envelope by corrugations which strongly attenuate wavelength $\lambda_{R3}$. Addition of the attenuation notches, 64-65, 68-69, and 70-71 yields the comparatively low spectral amplitudes denoted by lines 72 and 73. Thus the resulting spectral amplitude shape for the device is provided by lines 60, 64, 72, 73, 71 and 61. The spectral amplitude between $\lambda_{R1}$ and $\lambda_{R3}$, denoted by lines 72 and 73 is substantially less than the amplitude denoted by phantom line 62 which represents the spectral amplitude of an uncorrugated device.

Of course, for simplicity, the attached figures show only a few corrugation wavelengths. The actual number of corrugation wavelengths required for effective attenuation depends upon the amplitudes of the SAW attenuation peak at $\alpha_1$ and $\alpha_2$ in FIG. 5. However, based upon review of the Sabine data, between 10 and 1000 corrugations will provide effective attenuation.

Figure 2:
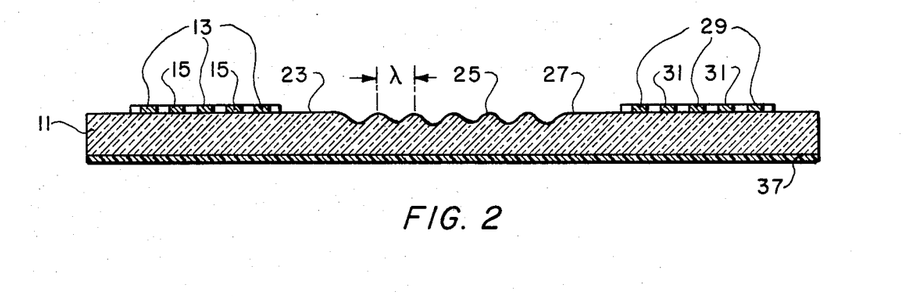
FIG. 2 is a side elevation cross-sectional view of the device of FIG. 1, cut along the line 2—2 and looking in the direction of the arrows.
Figure 4:
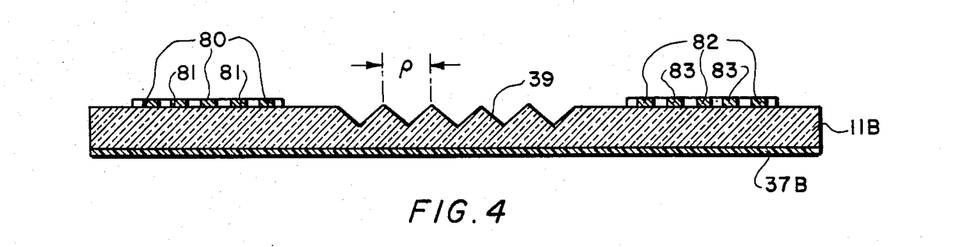
FIG. 4 is a side elevation cross-sectional view of another alternative embodiment of the present invention.

An alternative preferred embodiment of the present invention employs sawtooth-shaped corrugations instead of sinusoidal corrugations. To effectively scatter a particular SAW wavelength, $\lambda_R$, the sawtooth peak-to-peak distance must correspond to the appropriate sinusoidal corrugation scattering wavelength $\lambda$. FIG. 4. is illustrative of the sawtooth embodiment. In FIG. 4, input interdigital transducers 80 and 81 and output interdigital transducers 82 and 83 are deposited upon a piezoelectric substrate 11B with sound absorbing material 37B on its bottom surface. A series of sawtooth corrugations 39 is cut into the upper surface of the piezoelectric substrate 11B between the input IDTs 80 and 81 and the output IDTs 82 and 83. The peak-to-peak distance, p, in FIG. 4 is analogous to the sinusoidal corrugation wavelength, $\lambda$ of FIG. 2. The sawtooth corrugations 39 will strongly scatter incoming SAWs with acoustic wavelengths, $\lambda_{R1}$ upon ST-cut quartz when, as shown before, $0.3p \leq \lambda_R \leq 0.6p$ or
$1.4p \leq \lambda_R \leq 2.05p$.

Fabrication of sawtooth corrugations is somewhat simpler than fabrication of sinusoidal corrugations. Sawtooth corrugations provide somewhat less effective scattering and, therefore, a greater number of sawtooth corrugations is required to achieve any predetermined level of attenuation. Sawtooth corrugations may be fabricated by the previously-mentioned ion milling or photolytic etching techniques disclosed in U.S. Pat. Nos. 4,388,146 and 4,389,275.

An alternative fabrication method which is simple and inexpensive, for fabricating sawtooth corrugations, is to etch the quartz surface with a solution of ammonium bifluoride (NH$_4$F.HF) and Hydrofluoric acid. The ammonium bifluoride etching technique is described in John Vig et al., "Etching Studies on Singly and Doubly Rotated Quartz Plates," Proc. 33rd An. Freq Control Symposium, U.S. Army Electronics R&D Command, Ft. Monmouth, N.J., pp. 351–358, 1979.

The above-referenced etching method is suitable for batch production. By adjusting the ratio of the etchants, the duration of the etching process and the temperature of the process, one can produce a sawtooth-type surface upon a quartz crystal. The sawtooth-type corrugations produced by etching are obviously less uniform than corrugations produced by the aforementioned ion milling or photolytic processes. However, a large number of reasonably uniform etched corrugations may be made very quickly and cheaply.

The illustrative embodiments herein are merely a few of those possible variations which will occur to those skilled in the art while using the inventive principles contained herein. Accordingly, numerous variations of the invention are possible while staying within the spirit and scope of the invention as defined in the following claims.

What is claimed is:

1. An acoustic surface wave device comprising:
   a substrate of material capable of supporting both surface acoustic waves and bulk acoustic waves;
   input means for launching surface acoustic waves upon said substrate;
   output means for receiving surface acoustic waves propagating upon said substrate; and
   a plurality of groups of periodic corrugations disposed upon the surface of said substrate between said input and said output means, each of said groups serving to attenuate surface acoustic waves of a respective predetermined wavelength traversing said surface, each of said groups of corrugations causing scattering of said respective surface acoustic waves of predetermined wavelength to produce bulk acoustic waves.

2. The device of claim 1, further comprising means for absorbing said bulk acoustic waves.

3. The device of claim 1, wherein each of said groups has a different wavelength, $\lambda_i$, i=1, 2, ... n; each of said corrugation wavelengths, $\lambda_i$, attenuating a specific unwanted surface acoustic wave of wavelength, $\lambda_{Ri}$, according to the formula: $\lambda_i = \lambda_{Ri}/\alpha_j$, i=1, 2, ... n; j=1, 2 and wherein $\alpha_j$ is the abscissa of one of the maximal values of the surface wave attenuation curve for said substrate.

4. The device of claim 3,
   wherein said substrate is a piezoelectric material;
   said input means is a first interdigital transducer formed upon said substrate, said interdigital transducer having a pair of opposed transducer pads from which extend a plurality of alternating interdigitated electrode fingers for exciting a surface acoustic wave spectral band in response to an electrical signal applied thereto, the spacing, "S," between the centers of adjacent electrode fingers being given by $S = \lambda_{Rc}/2$ where $\lambda_{Rc}$ is a wavelength at substantially the center of said acoustic wave band;
   said output means is a second output interdigital transducer formed on said substrate, said second interdigital transducer having a pair of opposed transducer pads from which extend a plurality of interdigital electrode fingers configured and spaced substantially the same as said interdigital electrode fingers of said first interdigital transducer; and
   wherein said specific unwanted acoustic wavelengths, $\lambda_{Ri}$ satisfy the relationship
   $$\lambda_{Rc} - w/2 < \lambda_{Ri} < \lambda_{Rc} + w/2$$
   wherein i=1, ... n
   and wherein w is the effective width of said acoustic wave spectral band emanating from said input interdigital transducer.

5. The device of claim 2 wherein said means for absorbing said bulk acoustic waves comprises polyimide.

6. The device of claim 2 wherein said means for absorbing said bulk acoustic waves is a resin.

7. The device of claim 3 wherein said substrate is SST-cut quartz.

8. The device of claim 3 wherein said substrate is ST-cut quartz, and $\alpha_1$ is between 0.3 and 0.6 and $\alpha_2$ is between 1.4 and 2.05.

* * * * *